(12) United States Patent
Liao et al.

(10) Patent No.: US 7,211,948 B2
(45) Date of Patent: May 1, 2007

(54) USING A CRYSTALLIZATION-INHIBITOR IN ORGANIC ELECTROLUMINESCENT DEVICES

(75) Inventors: Liang-Sheng Liao, Rochester, NY (US); Kevin P. Klubek, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 376 days.

(21) Appl. No.: 10/756,663

(22) Filed: Jan. 13, 2004

(65) Prior Publication Data

US 2005/0151466 A1 Jul. 14, 2005

(51) Int. Cl.
*H05B 33/14* (2006.01)
(52) U.S. Cl. .................. 313/506; 313/504; 428/690
(58) Field of Classification Search ............ 313/504, 313/506; 428/690, 917
See application file for complete search history.

(56) References Cited

U.S. PATENT DOCUMENTS

| 4,769,292 | A | | 9/1988 | Tang et al. | |
|---|---|---|---|---|---|
| 2002/0086180 | A1 | | 7/2002 | Seo et al. | |
| 2002/0121860 | A1 | * | 9/2002 | Seo et al. | 313/506 |
| 2003/0049489 | A1 | * | 3/2003 | Hatwar et al. | 428/690 |
| 2005/0074629 | A1 | * | 4/2005 | Forrest et al. | 428/690 |

FOREIGN PATENT DOCUMENTS

| EP | 0 786 926 | 7/1997 |
|---|---|---|
| EP | 1 215 945 | 6/2002 |
| JP | 04334894 | 11/1992 |
| JP | 05-255664 | 10/1993 |
| JP | 09268283 | 10/1997 |
| JP | 11149983 | 6/1999 |
| JP | 2000208264 | 7/2000 |

OTHER PUBLICATIONS

Tang et al., "Organic Electroluminescent Diodes", *Applied Physics Letters*, 51, 913 (1987).
Adachi et al., "Electroluminescence in Organic Films with Three-Layer Structure", *Japanese Journal of Applied Physics*, 27, L269 (1988).
Tang et al., "Electroluminescence of Doped Organic Thin Films", *Journal of Applied Physics*, 65, 3610 (1989).

* cited by examiner

*Primary Examiner*—Mariceli Santiago
*Assistant Examiner*—Matt Hodges
(74) *Attorney, Agent, or Firm*—Raymond L. Owens

(57) ABSTRACT

An organic electroluminescent device includes an anode; a hole-transporting layer disposed over the anode, a light-emitting layer disposed over the hole-transporting layer for producing light in response to hole-electron recombination, and an electron-transporting layer disposed over the light-emitting layer. The device also includes a crystallization-inhibitor incorporated within the electron-transporting layer, wherein the crystallization-inhibitor prevents the electron-transporting layer from crystallizing during operation, and a cathode disposed over the electron-transporting layer.

9 Claims, 2 Drawing Sheets

USING A CRYSTALLIZATION-INHIBITOR IN ORGANIC ELECTROLUMINESCENT DEVICES

FIELD OF INVENTION

The present invention relates to improving the performance of an organic electroluminescent (EL) device. More specifically this invention relates to inhibiting the crystallization of organic layers in an organic EL device.

BACKGROUND OF THE INVENTION

Organic electroluminescent (EL) devices or organic light-emitting devices (OLEDs) are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al. demonstrated highly efficient OLEDs using such a layer structure in "Organic Electroluminescent Diodes", *Applied Physics Letters,* 51, 913 (1987) and in commonly assigned U.S. Pat. No. 4,769,292. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics,* 27, L269 (1988), and by Tang et al., "Electroluminescence of Doped Organic Thin Films", *Journal of Applied Physics,* 65, 3610 (1989). The LEL commonly includes of a host material doped with a guest material. Further, there are other multi-layer OLEDs that contain additional functional layers, such as a hole-injecting layer (HIL), and/or an electron-injecting layer (EIL), and/or an electron-blocking layer (EBL), and/or a hole-blocking layer (HBL) in the devices. At the same time, many different types of EL materials are also synthesized and used in OLEDs. These new structures and new materials have further resulted in improved device performance.

In an OLED, crystallization of an organic layer is detrimental to the device performance, especially if the ETL is the one undergoing the crystallization process in the device. During device operation, if the temperature inside of a device (defined as device temperature) is higher than a glass transition temperature (Tg) of an organic layer in the OLED, the organic layer will change its film formation from an amorphous state to a polycrystalline formation. This change will not only cause a film morphology change, but also cause a possible change in its ionization potential (Ip) and/or its electron energy band gap (Eg). As a result, electrical shorts can occur, carrier injection can deteriorate, or luminance efficiency can be reduced. Therefore, selecting high Tg materials, especially high Tg electron-transporting materials, is very necessary for the application of OLEDs. Tg of organic materials can be obtained using a technique such as differential scanning colorimetry.

Tris(8-hydroxyquinoline)aluminum (Alq), one of the metal chelated oxinoid compounds, has been a commonly used electron-transporting material in OLEDs since Tang et al. disclosed its use in "Organic Electroluminescent Diodes", *Applied Physics Letters,* 51, 913 (1987). Alq has a reasonably high Tg (about 172° C.). This property facilitates the operational stability of the OLEDs at a device temperature up to its Tg. However, the electron mobility of Alq is not quite as good as is expected. In order to improve the electron-transporting property in OLEDs, efforts are being made to try to use some other electron-transporting materials, such as other metal chelated oxinoid compounds, butadiene derivatives, heterocyclic optical brighteners, benzazoles, oxadiazoles, triazoles, pyridinethiadiazoles, triazines, and some silole derivatives. Among those materials, it is found that 4,7-diphenyl-1,10-phenanthroline (Bphen) has a very high electron mobility.

Due to its high electron mobility and suitable energy band structure, Bphen as an electron-transporting material in an ETL of an OLED can efficiently transport electrons from the cathode into the LEL resulting in high luminous efficiency and low drive voltage. Unfortunately, Bphen has a low Tg (about 60° C.), and a vacuum deposited amorphous Bphen layer in an OLED can be readily changed into a polycrystalline layer during operation, which results in a sudden drop in luminance and a sudden increase in drive voltage. Its operational lifetime is no longer than 20 hrs if the device is operated at 70° C., substantially minimizing the effectiveness of this material in an OLED.

SUMMARY OF THE INVENTION

It is therefore an object of the present invention to inhibit the crystallization of a low Tg ETL in an OLED.

It is another object of the present invention to make available for practical use in OLED devices a wider range of electron-transporting materials.

These objects are achieved by an organic electroluminescent device, comprising:

a) an anode;

b) a hole-transporting layer disposed over the anode;

c) a light-emitting layer disposed over the hole-transporting layer for producing light in response to hole-electron recombination;

d) an electron-transporting layer disposed over the light-emitting layer;

e) a crystallization-inhibitor incorporated within the electron-transporting layer, wherein the crystallization-inhibitor prevents the electron-transporting layer from crystallizing during operation; and f) a cathode disposed over the electron-transporting layer.

The present invention makes use of a crystallization-inhibitor in the electron-transporting layer. It has been discovered that by incorporating a crystallization-inhibitor in electron-transporting materials, their effectiveness can be significantly improved. By this arrangement, the ETL can maintain its amorphous film formation at a temperature higher than the Tg of the electron-transporting material, and improve the EL performance of the OLED.

DETAILED DESCRIPTION OF THE INVENTION

Figure 1:
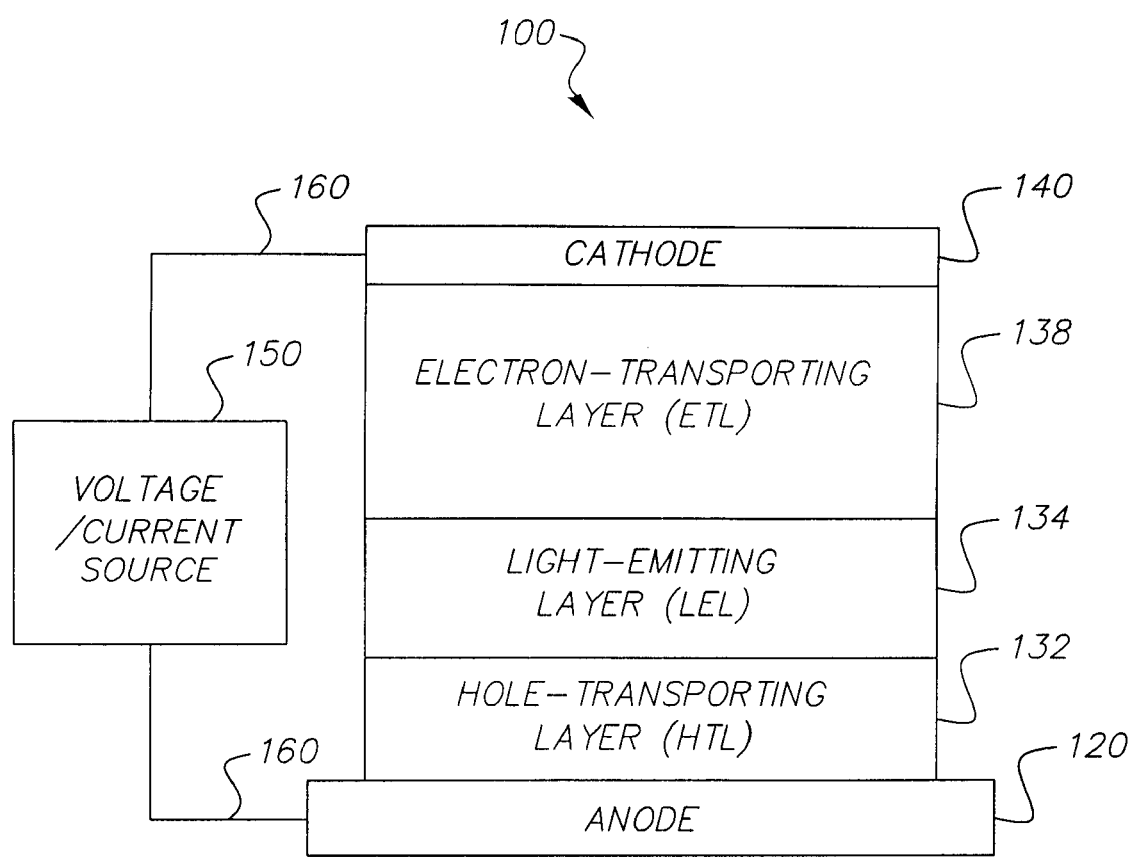
FIG. 1 shows a cross-sectional view of the present invention having a crystallization-inhibitor incorporated within the electron-transporting layer.

FIG. 1 is a cross-sectional view of an OLED 100 in accordance with the present invention. OLED 100 has an anode 120 and a cathode 140, at least one of which is transparent. Disposed between the anode and the cathode are at least a HTL 132, a LEL 134, and an ETL 138. This device is externally connected to a voltage/current source 150 through electrical conductors 160.

The particular device feature of the present invention is that the ETL 138 in the device contains both an electron-transporting material and a crystallization-inhibitor. The crystallization-inhibitor is defined as a material incorporated within a solid film such that the material can prevent the film from crystallization at certain conditions, such as, at temperatures higher than the Tg of the virgin solid film.

As is known, some electron-transporting materials have very good electron mobility and are potentially useful in OLEDs. However, these materials usually have low molecular weight and small molecular size resulting in a low Tg. A thin solid film including a low Tg material can readily change from being amorphous to polycrystalline at high temperature, or under certain electrical fields, or under certain environmental conditions. One of the ways to improve the thermal property of the film is to modify the molecular structure of the material in the film. However, as an alternative way, the present invention incorporates a crystallization-inhibitor within the film to improve its thermal property and to stabilize its film formation.

As a crystallization-inhibitor, a material should have very good thermal properties. Therefore, the crystallization-inhibitor is selected from organic materials having a Tg higher than 70° C. The organic material can be an electron-transporting material or a hole-transporting material. Preferably, the crystallization-inhibitor is an electron-transporting material because it will not only improve the thermal stability but also will maintain a comparable electron-transporting property of the ETL. When the molecular ratio of the crystallization-inhibitor to the electron-transporting material is higher than 0.3, the crystallization-inhibitor can effectively stop the crystallization process at the temperature up to the Tg of the crystallization-inhibitor, or even at a temperature higher than the Tg of the crystallization-inhibitor in some instances. From a practical deposition point of view, if the crystallization-inhibitor is an electron-transporting material, its concentration in the electron-transporting layer can have a wide range. For example, the concentration can range from 10 percent by volume to as high as 60 percent by volume. Preferably, the concentration of the crystallization-inhibitor in the electron-transporting layer is in the range of from 20 percent to 50 percent by volume.

The crystallization-inhibitor includes, but is not limited to, metal chelated oxinoid compounds, anthracene derivatives, various butadiene derivatives, various heterocyclic optical brighteners, benzazoles, oxadiazoles, triazoles, pyridinethiadiazoles, triazines, and some silole derivatives. For example, the crystallization-inhibitor includes tris(8-hydroxyquinoline)aluminum (Alq), 2-(1,1-dimethyethyl)-9,10-bis(2-naphthalenyl) anthracene (TBADN), and 9,10-di-(2-naphthyl) anthracene (ADN).

Once the crystallization-inhibitor is incorporated within the ETL, it should not cause severe optical absorption. Therefore, the crystallization-inhibitor has an optical energy band gap wider than 1.5 eV. Preferably, the crystallization-inhibitor has an optical energy band gap wider than the optical energy band gap of the electron-transporting material.

The crystallization-inhibitor can also be selected from inorganic materials having a melting point higher than 100° C. The inorganic material includes any metal or metal compound as long as the material can prevent the ETL film from crystallization when the inorganic material is incorporated within the ETL. In this case, the molecular ratio of the crystallization-inhibitor to the electron-transporting material is in the range of from 0.3 to 5. Preferably, the molecular ratio of the crystallization-inhibitor to the electron-transporting material is in the range of from 0.3 to 2.

The crystallization-inhibitor can be incorporated within the ETL by simultaneously co-evaporating both the crystallization-inhibitor and the electron-transporting material. The crystallization-inhibitor can also be incorporated within the ETL by forming alternative sublayers of electron-transporting material and crystallization-inhibitor, such as with the sequence of A/B/A/B/ . . . /A, until reaching the desired thickness of the ETL, wherein "A" stands for the sublayer of the electron-transporting material, and "B" the sublayer of the crystallization-inhibitor. During or after the evaporation, inter-diffusion occurs between these sublayers. Therefore, the crystallization-inhibitor can actually be incorporated within the ETL using this method.

The OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials. It is necessary to provide in these device configurations a light-transparent top electrode.

When EL emission is viewed through anode 120, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum-or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque or reflective. Example conductors for this application include, but are not limited to, gold, iridium, molybdenum, palladium, and platinum. Typical anode materials, transmissive or otherwise, have a work function higher than 4.0 eV. Desired anode materials are commonly deposited by any suitable way such as evaporation, sputtering, chemical vapor deposition, or electrochemical means. Anodes can be patterned using well known photolithographic processes. Optionally, anodes can be polished prior to the deposition of other layers to reduce surface roughness so as to minimize electrical shorts or enhance reflectivity.

While not always necessary, it is often useful to provide a HIL in contact with anode 120. The HIL can serve to improve the film formation property of subsequent organic layers and to facilitate injection of holes into the HTL reducing the driving voltage of the OLED. Suitable materials for use in the HIL include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA(4,4',4"-tris[(3-ethylphenyl)phenylamino]triphenylamine). Alternative hole-injecting materials reportedly useful in organic EL devices are described in EP 0 891 121 A1 and EP 1029 909 A1.

A p-type doped organic layer is also useful for the HIL as described in U.S. Pat. No. 6,423,429 B2. A p-type doped organic layer means that the layer is electrically conductive, and the charge carriers are primarily holes. The conductivity is provided by the formation of a charge-transfer complex as a result of electron transfer from the host material to the dopant material.

HTL 132 in the OLED contains at least one hole-transporting compound such as an aromatic tertiary amine, which is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the LEL 134 in OLED 100 includes a luminescent or fluorescent material where electroluminescence is produced as a result of electron-hole pair recombination in this region. The LEL can be comprised of a single material, but more commonly includes of a host material doped with a guest compound or compounds where light emission comes primarily from the dopant and can be of any color. The host materials in the LEL can be an electron-transporting material, a hole-transporting material, or another material or combination of materials that support hole-electron recombination. The dopant is usually selected from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)].

Other classes of useful host materials include, but are not limited to, derivatives of anthracene, such as 2-(1,1-dimethyethyl)-9,10-bis(2-naphthalenyl) anthracene (TBADN), 9,10-di-(2-naphthyl) anthracene (ADN), and derivatives thereof as described in U.S. Pat. No. 5,935,721, distyrylarylene derivatives as described in U.S. Pat. No. 5,121,029, benzazole derivatives, for example, 2,2',2"-(1,3,5-phenylene)tris[1-phenyl-1H-benzimidazole], and blue emitting metal chelated oxinoid compounds, for example, Bis(2-methyl-8-quinolinolato)(4-phenylphenolato)aluminum (B-Alq). Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

Preferred thin film-forming materials for use in forming the ETL 138 in OLED 100 are metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, and some silole derivatives are also useful electron-transporting materials.

Since there is a crystallization-inhibitor in the ETL, the material selection range can be extended. The electron-transporting material with a Tg lower than 70° C., even as low as 50° C., can now be used in the ETL, such as 4,7-diphenyl-1,10-phenanthroline (Bphen), 2,9-dimethyl-4,7-diphenyl-1,10-phenanthroline (BCP), and their derivatives. When a crystallization-inhibitor is incorporated within an ETL having a high Tg (higher than 70° C.) electron-transporting material, such as 2,2'-(1,1'-biphenyl)-4,4'-diyl-bis(4,6-(p-tolyl)-1,3,5-triazine) (TRAZ), the film formation and the electron-transporting property of the ETL can also be improved.

An n-type doped organic layer is also useful for the ETL as described in U.S. Pat. No. 6,013,384. An n-type doped organic layer means that the layer is electrically conductive, and the charge carriers are primarily electrons. The conductivity is provided by the formation of a charge-transfer complex as a result of electron transfer from the dopant material to the host material. In this case, the ETL contains electron-transporting material, crystallization-inhibitor, and the n-type dopant material. The n-type dopant material, for example, is Li, Na, K, Rb, or Cs.

When light emission is viewed solely through the anode, the cathode 140 used in the present invention can be comprised of nearly any conductive material. Desirable materials have good film-forming properties to ensure good contact with the underlying organic layer, promote electron injection at low voltage, and have good stability. Useful cathode materials often contain a low work-function metal (<4.0 eV) or metal alloy. One preferred cathode material is comprised of a MgAg alloy wherein the percentage of silver is in the range of 1 to 20%, as described in U.S. Pat. No. 4,885,221. Another suitable class of cathode materials includes bilayers comprising a thin inorganic EIL in contact with an organic layer (e.g., ETL), which is capped with a thicker layer of a conductive metal. Here, the inorganic EIL preferably includes a low work-function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or includes these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; JP 3,234,963; and EP 1076 368. Cathode materials are typically deposited by thermal evaporation, electron-beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

In some instances, an organic EIL, which can optionally be named as ETL, serves the function of supporting both electron-injection and electron-transport; and an organic HIL, which can optionally be named as HTL, serves the function of supporting both hole-injection and hole-transport. It is also known in the art that emitting dopants can be added to an HTL, which can serve as a host. Multiple dopants can be added to one or more layers in order to create a white-emitting OLED, for example, by combining blue- and yellow-emitting materials, cyan-and red-emitting materials, or red-, green-, and blue-emitting materials. White-emitting devices are described, for example, in U.S. patent application Publication Ser. No. 2002/0025419 A1; U.S. Pat. Nos. 5,683,823; 5,503,910; 5,405,709; 5,283,182; EP 1 187 235; and EP 1 182 244.

Additional layers such as electron or hole-blocking layers as taught in the art can be employed in devices of the present invention. Hole-blocking layers are commonly used to improve efficiency of phosphorescent emitter devices, for example, as in U.S. patent application Publication Ser. No. 2002/0015859 A1.

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be pre-mixed and coated from a single boat or donor sheet. For full color display, the pixelation of LELs may be needed. This pixelated deposition of LELs can be achieved using shadow masks, integral shadow masks (U.S. Pat. No. 5,294,870), spatially defined thermal dye transfer from a donor sheet (U.S. Pat. Nos. 5,688,551; 5,851,709; and 6,066,357), and inkjet method (U.S. Pat. No. 6,066,357).

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of the present invention can employ various well known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings can be specifically provided over the cover or as part of the cover.

The present invention can be employed in most OLED configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

The entire contents of the patents and other publications referred to in this specification are incorporated herein by reference.

EXAMPLES

The present invention and its advantages can be better appreciated by the following inventive and comparative examples. For purposes of brevity, the materials and layers formed therefrom will be abbreviated as given below.

ITO: indium-tin-oxide; used in forming the transparent anode on glass substrates CFx: polymerized fluorocarbon layer; used in forming a hole-injecting layer on top of ITO NPB: N,N'-di(naphthalene-1-yl)-N,N'-diphenyl-benzidine; used in forming the hole-transporting layer TBADN: 2-(1,1-dimethyethyl)-9,10-bis(2-naphthalenyl)anthracene; used as the host material in forming the light-emitting layer TBP: 2,5,8,11-tetra-t-butylperylene; used as the dopant material in the light-emitting layer Alq: tris(8-hydroxyquinoline)aluminum(III); used in forming the electron-transporting layer, or used as a crystallization-inhibitor in the electron-transporting layer Bphen: 4,7-diphenyl-1,10-phenanthroline; used in forming the electron-transporting layer TRAZ: 2,2'-(1,1'-biphenyl)-4,4'-diylbis(4,6-(p-tolyl)-1,3,5-triazine); used in forming the electron-transporting layer MgAg: magnesium:silver at a ratio of 10:0.5 by volume; used in forming the cathode.

In the following examples, the thickness of the organic layers and the doping concentration were controlled and measured in situ using calibrated thickness monitors (INFICON IC/5 Deposition Controller). The electroluminescence characteristics of all the fabricated devices were evaluated using a constant current source (KEITHLEY 2400 SourceMeter) and a photometer (PHOTO RESEARCH SpectraScan PR 650) at room temperature. During the operational lifetime test, the devices being tested were driven at a current density of 20 mA/cm$^2$ in a 70° C. oven (VWR Scientific Products).

Example 1 (Comparative Example)

The preparation of a conventional OLED is as follows: A~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing CHF$_3$ gas in an RF plasma treatment chamber. The substrate was then transferred into a vacuum deposition chamber (TROVATO MFG. INC) for deposition of all other layers on top of the substrate. The following layers were deposited in the following sequence by evaporation from a heated boat under a vacuum of approximately 10$^{-6}$ Torr:

(1) a HTL, 90 nm thick, including NPB;
(2) a LEL, 20 nm thick, including Alq;
(3) an ETL, 40 nm thick, including Alq as well; and
(4) a cathode, approximately 210 nm thick, including MgAg.

Figure 2:
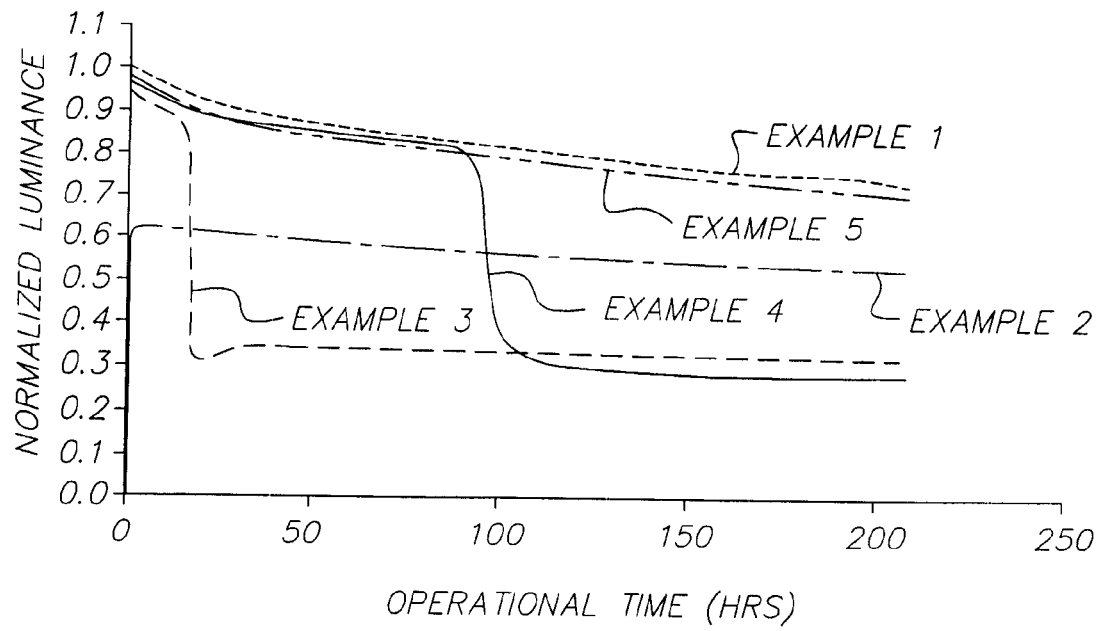
FIG. 2 is a graph, showing normalized luminance versus operational time, demonstrating the operational stability of the OLEDs fabricated in accordance with the present invention as well as the prior art.

After the deposition of these layers, the device was transferred from the deposition chamber into a dry box (VAC Vacuum Atmosphere Company) for encapsulation. The completed device structure is denoted as ITO/CFx/NPB (90)/Alq(20)/Alq(40)/MgAg. The EL performance of the device, measured at a current density of 20 mA/cm$^2$, is shown in Table I, wherein the drive voltage, luminance, luminous efficiency, power efficiency, EL peak, and the T$_{70}$(70° C.) (a time at which the luminance retains 70% of its initial value after being operated at 70° C.) are listed. The normalized luminance vs. operational time is shown in FIG. 2.

Example 2 (Comparative Example)

An OLED was constructed in the manner described in Example 1, except in Step (3) wherein the 40-nm-thick Alq ETL is now replaced by a 40-nm-thick Bphen ETL. The completed device structure is denoted as ITO/CFx/NPB(90)/Alq(20)/Bphen(40)/MgAg. The EL performance of the device, measured at a current density of 20 mA/cm$^2$, is shown in Table I, wherein the drive voltage, luminance, luminous efficiency, power efficiency, EL peak, and the T$_{70}$(70° C.) are listed. The normalized luminance vs. operational time is shown in FIG. 2.

Example 3 (Inventive Example)

An OLED was constructed in the manner described in Example 1, except in Step (3) wherein the 40-nm-thick Alq ETL is now replaced by a 40-nm-thick Bphen ETL which contains Alq, 10% by volume, as a crystallization-inhibitor. The completed device structure is denoted as ITO/CFx/NPB (90)/Alq(20)/Bphen:Alq(10%)(40)/MgAg. The EL performance of the device, measured at a current density of 20 mA/cm$^2$, is shown in Table I, wherein the drive voltage, luminance, luminous efficiency, power efficiency, EL peak, and the $T_{70}(70°\text{ C.})$ are listed. The normalized luminance vs. operational time is shown in FIG. 2.

Example 4 (Inventive Example)

An OLED was constructed in the manner described in Example 1, except in Step (3) wherein the 40-nm-thick Alq ETL is now replaced by a 40-nm-thick Bphen ETL which contains Alq, 20% by volume, as a crystallization-inhibitor. The completed device structure is denoted as ITO/CFx/NPB (90)/Alq(20)/Bphen:Alq(20%)(40)/MgAg. The EL performance of the device, measured at a current density of 20 mA/cm², is shown in Table I, wherein the drive voltage, luminance, luminous efficiency, power efficiency, EL peak, and the $T_{70}(70°\text{ C.})$ are listed. The normalized luminance vs. operational time is shown in FIG. 2.

Example 5 (Inventive Example)

An OLED was constructed in the manner described in Example 1, except in Step (3) wherein the 40-nm-thick Alq ETL is now replaced with a 40-nm-thick Bphen ETL which contains Alq, 30% by volume, as a crystallization-inhibitor. The completed device structure is denoted as ITO/CFx/NPB (90)/Alq(20)/Bphen:Alq(30%)(40)/MgAg. The EL performance of the device, measured at a current density of 20 mA/cm², is shown in Table I, wherein the drive voltage, luminance, luminous efficiency, power efficiency, EL peak, and the $T_{70}(70°\text{ C.})$ are listed. The normalized luminance vs. operational time is shown in FIG. 2.

thick, was deposited on the clean ITO surface as the HIL by decomposing $CHF_3$ gas in an RF plasma treatment chamber. The substrate was then transferred into a vacuum deposition chamber (TROVATO MFG. INC) for deposition of all other layers on top of the substrate. The following layers were deposited in the following sequence by evaporation from a heated boat under a vacuum of approximately $10^{-6}$ Torr:

(1) a HTL, 90 nm thick, including NPB;

(2) a LEL, 20 nm thick, including TBADN doped with 1.5% TBP by volume;

(3) an ETL, 35 nm thick, including Alq; and (4) a cathode, approximately 210 nm thick, including MgAg.

Figure 3:
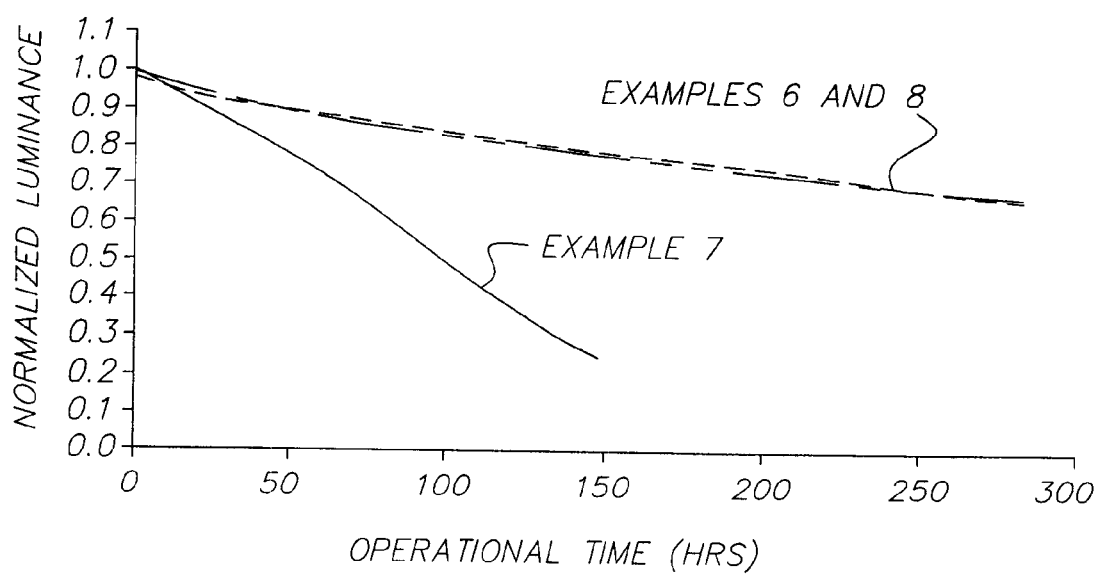
FIG. 3 is a graph, showing normalized luminance versus operational time, demonstrating the operational stability of the other OLEDs fabricated in accordance with the present invention as well as the prior art.

After the deposition of these layers, the device was transferred from the deposition chamber into a dry box (VAC Vacuum Atmosphere Company) for encapsulation. The completed device structure is denoted as ITO/CFx/NPB (90)/TBADN:TBP(1.5%)(20)/Alq(35)/MgAg. The EL performance of the device, measured at a current density of 20 mA/cm², is shown in Table II, wherein the drive voltage, luminance, luminous efficiency, power efficiency, EL peak, and the $T_{70}(70°\text{ C.})$ are listed. The normalized luminance vs. operational time is shown in FIG. 3.

Example 7 (Comparative Example)

A blue OLED was constructed in the manner described in Example 6, except in Step (3) wherein the 35-nm-thick Alq

TABLE I

| Example(Type) (EL measured @ 20 mA/cm²) | Voltage (V) | Luminance (cd/m²) | Luminous Efficiency (cd/A) | Power Efficiency (lm/W) | EL Peak (nm) | $T_{70}(70°\text{ C.})$ (Hrs) |
|---|---|---|---|---|---|---|
| 1 (Comparative) | 6.93 | 509 | 2.54 | 1.15 | 524 | >200 |
| 2 (Comparative) | 6.63 | 635 | 3.18 | 1.50 | 524 | <1.0 |
| 3 (Inventive) | 5.71 | 597 | 2.98 | 1.64 | 524 | 17 |
| 4 (Inventive) | 6.16 | 599 | 3.00 | 1.53 | 524 | 90 |
| 5 (Inventive) | 6.03 | 572 | 2.86 | 1.49 | 524 | >200 |

From the data shown in both Table I and FIG. 2, it is found that although the OLED containing a pure Bphen ETL (Example 2) has higher luminous efficiency and higher power efficiency than the device containing a pure Alq ETL (Example 1), its operational stability is very poor because its $T_{70}(70°\text{ C.})$ is less than 1 hour. However, when Alq is used as a crystallization-inhibitor incorporated within the Bphen ETL, the operational stability of the device is improved as the concentration of Alq is increased. When the concentration of Alq reaches 30% by volume in the Bphen ETL (Example 5), the operational stability of the device is comparable to that of the device in Example 1. Moreover, compared to Example 1, the device in Example 5 has lower drive voltage, higher luminous efficiency, and its power efficiency increases by about 30%.

Example 6 (Comparative Example)

The preparation of a blue OLED is as follows: A~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm ETL is now replaced by a 35-nm-thick TRAZ ETL. The completed device structure is denoted as ITO/CFx/NPB(90)/TBADN:TBP(1.5%)(20)/TRAZ(35)/MgAg. The EL performance of the device, measured at a current density of 20 mA/cm², is shown in Table II, wherein the drive voltage, luminance, luminous efficiency, power efficiency, EL peak, and the $T_{70}(70°\text{ C.})$ are listed. The normalized luminance vs. operational time is shown in FIG. 3.

Example 8 (Inventive Example)

A blue OLED was constructed in the manner described in Example 6, except in Step (3) wherein the 35-nm-thick Alq ETL is now replaced by a 35-nm-thick TRAZ ETL which contains Alq, 30% by volume, as a crystallization-inhibitor. The completed device structure is denoted as ITO/CFx/NPB (90)/TBADN:TBP(1.5%)(20)/TRAZ:Alq(30%)(35)/MgAg. The EL performance of the device, measured at a current density of 20 mA/cm², is shown in Table II, wherein the drive voltage, luminance, luminous efficiency, power efficiency, EL peak, and the $T_{70}(70°\text{ C.})$ are listed. The normalized luminance vs. operational time is shown in FIG. 3.

TABLE II

| Example(Type) (EL measured @ 20 mA/cm$^2$) | Voltage (V) | Luminance (cd/m$^2$) | Luminous Efficiency (cd/A) | Power Efficiency (lm/W) | EL Peak (nm) | T$_{70}$(70° C.) (Hrs) |
| --- | --- | --- | --- | --- | --- | --- |
| 6 (Comparative) | 7.30 | 541 | 2.71 | 1.17 | 464 | 235 |
| 7 (Comparative) | 7.01 | 474 | 2.37 | 1.06 | 464 | 65 |
| 8 (Inventive) | 6.25 | 488 | 2.44 | 1.23 | 464 | 235 |

Although TRAZ has a Tg higher than 70° C., it still has a stability problem when the OLED utilizing TRAZ as an ETL (Example 7) is operated at 70° C. When Alq (30% by volume) is incorporated into the TRAZ ETL as a crystallization-inhibitor (Example 8), the operational stability of the device is as good as that of the device utilizing Alq as an ETL (Example 6). Compared to Example 6, the power efficiency of the device in Example 8 increases and the drive voltage decreases.

The invention has been described in detail with particular reference to certain preferred embodiments thereof, but it will be understood that variations and modifications can be effected within the spirit and scope of the invention.

Parts List

100 OLED
120 anode
132 hole-transporting layer, HTL
134 light-emitting layer, LEL
138 electron-transporting layer, ETL
140 cathode
150 voltage/current source
160 electrical conductors

What is claimed is:

1. An organic electroluminescent device, comprising:
   a) an anode;
   b) a hole-transporting layer disposed over the anode;
   c) a light-emitting layer disposed over the hole-transporting layer for producing light in response to hole-electron recombination;
   d) an electron-transporting layer disposed over the light-emitting layer;
   e) a crystallization-inhibitor incorporated within the electron-transporting layer and wherein when the crystallization-inhibitor is an anthracene derivative, the concentration of the anthracene derivative is in the range greater than 25 percent by volume up to 50 percent by volume of the electron-transporting layer, wherein the crystallization-inhibitor prevents the electron-transporting layer from crystallizing during operation; and
   f) a cathode disposed over the electron-transporting layer.

2. The organic electroluminescent device of claim 1 wherein the electron-transporting layer has a glass transition temperature (Tg) higher than 50° C.

3. The organic electroluminescent device of claim 1 wherein the crystallization-inhibitor includes an organic material having a glass transition temperature (Tg) higher than 70° C.

4. The organic electroluminescent device of claim 3 wherein the crystallization-inhibitor has an optical energy band gap wider than 1.5 eV.

5. The organic electroluminescent device of claim 3 wherein the crystallization-inhibitor includes 2-(1,1-dimethylethyl)-9,10-bis(2-naphthalenyl) anthracene (TBADN) or 9,10-di-(2-naphthyl) anthracene (ADN).

6. The organic electroluminescent device of claim 1 wherein the molecular ratio of the crystallization-inhibitor to the electron-transporting material in the electron-transporting layer is in the range of from 0.3 to 5.

7. The organic electroluminescent device of claim 1 wherein the electron-transporting layer includes 4,7-diphenyl-1,10-phenanthroline (Bphen), 2,9-dimethyl-4,7-diphenyl-1,10-phenanthroline (BCP), or other phenanthroline derivatives.

8. The organic electroluminescent device of claim 1 wherein the electron-transporting layer includes 2,2'-(1,1'-biphenyl)-4,4'-diylbis (4,6-(p-tolyl)-1,3,5-triazine).

9. The organic electroluminescent device of claim 1 wherein the electron-transporting layer contains a host electron-transporting material doped with Li, Na, K, Rb, or Cs.

* * * * *